(12) United States Patent
Hosomi (10) Patent No.: US 9,693,462 B2
(45) Date of Patent: Jun. 27, 2017

(54) PRINTED CIRCUIT BOARD

(71) Applicant: Mitsubishi Electric Corporation, Tokyo (JP)

(72) Inventor: Takeshi Hosomi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 63 days.

(21) Appl. No.: 14/790,556

(22) Filed: Jul. 2, 2015

(65) Prior Publication Data

US 2016/0143148 A1    May 19, 2016

(30) Foreign Application Priority Data

Nov. 17, 2014  (JP) ................................. 2014-232651

(51) Int. Cl.
*H05K 1/18*    (2006.01)
*H05K 3/46*    (2006.01)
(Continued)

(52) U.S. Cl.
CPC ............ *H05K 1/183* (2013.01); *H01L 23/10* (2013.01); *H01L 23/13* (2013.01); *H01L 23/3135* (2013.01); *H01L 23/5389* (2013.01); *H01L 33/62* (2013.01); *H05K 3/4697* (2013.01); *H01L 23/3677* (2013.01); *H01L 24/13* (2013.01); *H01L 24/16* (2013.01); *H01L 24/29* (2013.01); *H01L 24/32* (2013.01); *H01L 24/45* (2013.01); *H01L 24/48* (2013.01); *H01L 24/73* (2013.01);
(Continued)

(58) Field of Classification Search
CPC ...................... H05K 1/183; H05K 2201/09036

USPC .......................................... 361/761, 763, 764
See application file for complete search history.

(56) References Cited

U.S. PATENT DOCUMENTS 4,630,172 A * 12/1986 Stenerson ........... H01L 21/4857
257/713
5,796,165 A    8/1998 Yoshikawa et al.
(Continued)

FOREIGN PATENT DOCUMENTS

JP    S63-271969 A    11/1988
JP    H01-228156 A     9/1989
(Continued)

OTHER PUBLICATIONS

An Office Action issued by the Taiwanese Patent Office on Nov. 28, 2016, which corresponds to Taiwanese Patent Application No. 104119514 and is related to U.S. Appl. No. 14/790,556; with English language partial translation.

*Primary Examiner* — Binh Tran
(74) *Attorney, Agent, or Firm* — Studebaker & Brackett PC (57) ABSTRACT

A printed circuit board includes: a printed wiring board including an insulating layer wherein a recessed part is provided on a top surface of the insulating layer, and a printed conductor provided inside the recessed part; a bare chip part mounted in the recessed part and electrically connected to the printed conductor; an electronic part mounted on the top surface of the printed wiring board other than the recessed part; and a cap fixed to the top surface of the printed wiring board and hollow-sealing the bare chip part mounted in the recessed part, wherein using a height of the top surface of the printed wiring board as a reference, a height of a top surface of the cap is equal to or below a maximum height of a top surface of the electronic part.

7 Claims, 7 Drawing Sheets

(51) Int. Cl.
*H01L 33/62* (2010.01)
*H01L 23/10* (2006.01)
*H01L 23/13* (2006.01)
*H01L 23/31* (2006.01)
*H01L 23/538* (2006.01)
*H05K 7/00* (2006.01)
*H05K 1/02* (2006.01)
*H01L 27/146* (2006.01)
*H01L 23/367* (2006.01)
*H01L 23/00* (2006.01)
*H01L 25/16* (2006.01)

(52) U.S. Cl.
CPC .............. *H01L 24/92* (2013.01); *H01L 25/16* (2013.01); *H01L 27/14618* (2013.01); *H01L 2224/0401* (2013.01); *H01L 2224/04026* (2013.01); *H01L 2224/04042* (2013.01); *H01L 2224/06181* (2013.01); *H01L 2224/131* (2013.01); *H01L 2224/16227* (2013.01); *H01L 2224/2919* (2013.01); *H01L 2224/29139* (2013.01); *H01L 2224/29144* (2013.01); *H01L 2224/29339* (2013.01); *H01L 2224/32225* (2013.01); *H01L 2224/32245* (2013.01); *H01L 2224/45139* (2013.01); *H01L 2224/45144* (2013.01); *H01L 2224/45147* (2013.01); *H01L 2224/48091* (2013.01); *H01L 2224/48227* (2013.01); *H01L 2224/48229* (2013.01); *H01L 2224/73265* (2013.01); *H01L 2224/92247* (2013.01); *H01L 2924/14* (2013.01); *H01L 2924/142* (2013.01); *H01L 2924/15153* (2013.01); *H01L 2924/15192* (2013.01); *H01L 2924/15313* (2013.01); *H01L 2924/15333* (2013.01); *H01L 2924/163* (2013.01); *H01L 2924/165* (2013.01); *H01L 2924/167* (2013.01); *H01L 2924/1659* (2013.01); *H01L 2924/1676* (2013.01); *H01L 2924/1679* (2013.01); *H01L 2924/16195* (2013.01); *H01L 2924/16251* (2013.01); *H01L 2924/16747* (2013.01); *H01L 2924/16787* (2013.01); *H01L 2924/16788* (2013.01); *H01L 2924/19041* (2013.01); *H01L 2924/19042* (2013.01); *H01L 2924/19043* (2013.01); *H05K 1/021* (2013.01); *H05K 1/0206* (2013.01); *H05K 2201/09036* (2013.01); *H05K 2201/1056* (2013.01); *H05K 2203/304* (2013.01)

(56) References Cited

U.S. PATENT DOCUMENTS

| | | | | |
|---|---|---|---|---|
| 6,107,683 | A * | 8/2000 | Castro | H01L 23/24 257/700 |
| 6,459,593 | B1 * | 10/2002 | Kwong | H01L 25/0652 174/255 |
| 2009/0115926 | A1 * | 5/2009 | Lim | G09F 9/302 349/44 |

FOREIGN PATENT DOCUMENTS

| | | |
|---|---|---|
| JP | H08-321567 A | 12/1996 |
| JP | H11-354691 A | 12/1999 |

* cited by examiner

PRINTED CIRCUIT BOARD

BACKGROUND OF THE INVENTION

Field of the Invention

The present invention relates to a printed circuit board mounted with a bare chip.

Background Art

Printed circuit boards in which wiring is formed on a substrate using a printed conductor and which are mounted with electronic parts are used in the fields of various electronic devices and electric devices. Downsized printed circuit boards on which parts are densely mounted allow electronic devices and electric devices to be reduced in thickness and size. In recent years, there are proposals on structures in which a part such as a semiconductor device or sensor stripped of a package, that is, a bare chip part is mounted on a printed wiring board in order to further reduce the thickness and size of the devices. There are also proposals on techniques whereby a bare chip is mounted in a recessed part provided on a top surface of a printed wiring board (e.g., Japanese Patent Laid-Open No. 8-321567 (see pp. 9 and 10, FIG. 1 and FIGS. 3 to 6)).

Conventionally, the interior of a recessed part in which a bare chip part is mounted is filled and sealed with resin. For this reason, wiring on the surface of the bare chip part or a wire connecting the bare chip part and a printed conductor of a printed wiring board may be deformed or peeled off due to a pressure when the resin is applied or stress when the resin hardens, causing deterioration of reliability.

Moreover, a dielectric constant of the resin causes a capacitance of wiring or between wires of the bare chip part to increase, and therefore high-frequency performance of the bare chip part deteriorates. For example, when the capacitance between wires on the surface of the bare chip part increases, leakage of a high-frequency signal between wires increases, causing an increase of noise included in an output signal from the bare chip part.

SUMMARY OF THE INVENTION

The present invention has been implemented to solve the above-described problems and it is an object of the present invention to provide a printed circuit board capable of preventing deterioration of reliability and high-frequency performance.

According to the present invention, a printed circuit board includes: a printed wiring board including an insulating layer wherein a recessed part is provided on a top surface of the insulating layer, and a printed conductor provided inside the recessed part; a bare chip part mounted in the recessed part and electrically connected to the printed conductor; an electronic part mounted on the top surface of the printed wiring board other than the recessed part; and a cap fixed to the top surface of the printed wiring board and hollow-sealing the bare chip part mounted in the recessed part, wherein using a height of the top surface of the printed wiring board as a reference, a height of a top surface of the cap is equal to or below a maximum height of a top surface of the electronic part.

In the present invention, the bare chip part mounted in the recessed part is hollow-sealed with the cap. For this reason, compared to the case where the bare chip part is sealed with the resin, it is possible to prevent deterioration of reliability and high-frequency performance. Moreover, since the height of the top surface of the cap is equal to or below a maximum height of the top surface of the electronic part, and therefore even when sealing with the cap is performed, the thickness of the printed circuit board does not increase.

Other and further objects, features and advantages of the invention will appear more fully from the following description.

DETAILED DESCRIPTION OF THE PREFERRED EMBODIMENTS

A printed circuit board according to the embodiments of the present invention will be described with reference to the drawings. The same components will be denoted by the same symbols, and the repeated description thereof may be omitted.

First Embodiment

Figure 1:
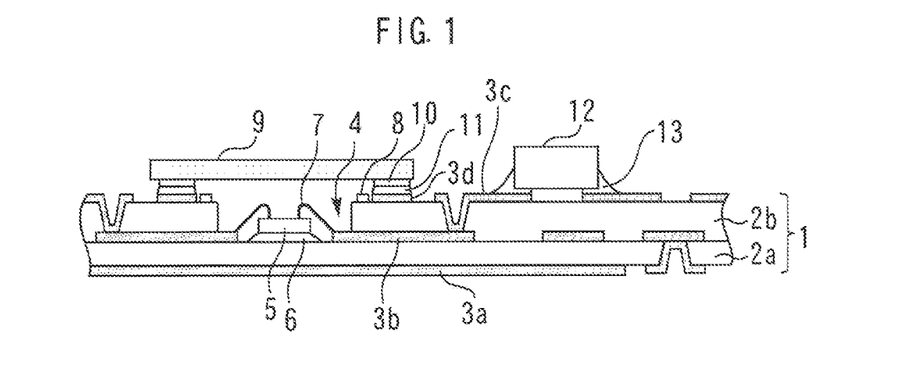
FIG. 1 is a cross-sectional view illustrating a printed circuit board according to a first embodiment of the present invention.

FIG. 1 is a cross-sectional view illustrating a printed circuit board according to a first embodiment of the present invention. The printed wiring board 1 has a structure in which insulating layers 2a and 2b of resin, glass or ceramics and printed conductors 3a to 3d of copper alloy or molybdenum or the like are alternately laminated. Note that the insulating layers 2a and 2b themselves may also have a multilayered structure including a plurality of insulating layers and a plurality of printed conductors.

The insulating layer 2b is opened and a recessed part 4 is provided on the top surface of the insulating layers 2a and 2b of the printed wiring board 1. The printed conductor 3b is provided inside the recessed part 4. A bare chip part 5 such as a transistor, diode or IC is mounted in the recessed part 4. The bare chip part 5 is fixed by a die bonding member 6 such as silver paste, gold tin solder or epoxy resin. The bare chip part 5 and the printed conductor 3b are electrically connected via a wire 7 which is a thinned alloy of gold, silver, copper or the like.

The printed conductor 3d is provided around the recessed part 4 in a ring shape and a solder flow stopper 8 is provided inside thereof. This printed conductor 3d and a ring-shaped solder joint 10 of a cap 9 are connected together by solder 11, and the cap 9 is thereby fixed to the top surface of the printed wiring board 1. In this way, the bare chip part 5 mounted in the recessed part 4 is hollow-sealed. The cap 9 is made of ceramics such as aluminum oxide or aluminum nitride and the solder joint 10 is made of molybdenum or gold or the like. The material of the cap 9 is not limited to ceramics, but may also be glass, plastic material such as fluororesin or polyimide, or a composite material such as glass-cloth epoxy resin board. Instead of the solder 11, silver paste or resin adhesive may also be used.

An electronic part 12 such as a capacitor, inductor, resistor, filter, diode, transistor or IC is mounted on the top surface of the printed wiring board 1 other than the recessed part 4 using solder 13. Using the height of the top surface of the printed wiring board 1 as a reference, the height of the top surface of the cap 9 is equal to or below a maximum height of the top surface of the electronic part 12.

Figure 2:
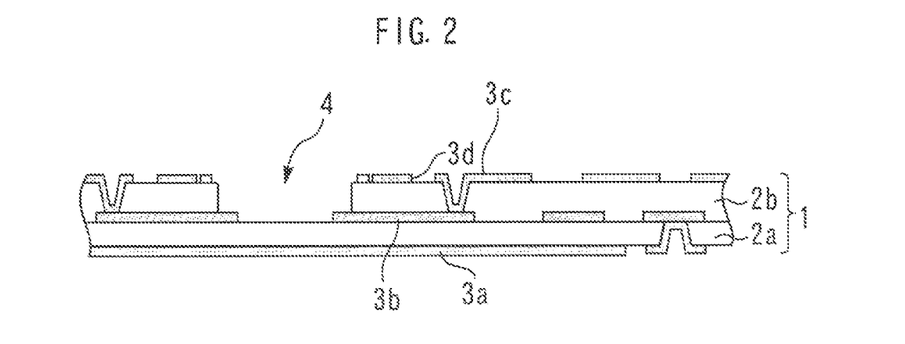
FIGS. 2 to 4 are cross-sectional views illustrating manufacturing steps of the printed circuit board according to the first embodiment of the present invention.
Figure 3:
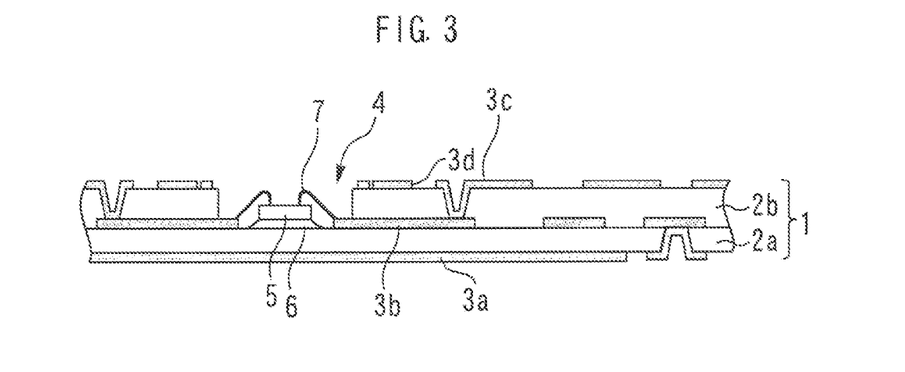
Figure 4:
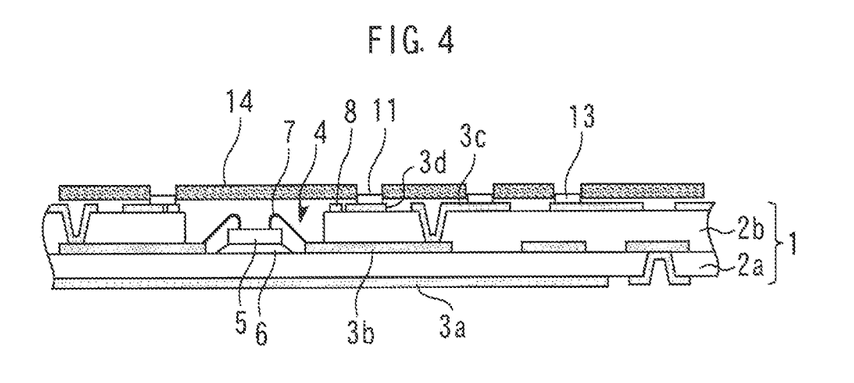

FIGS. 2 to 4 are cross-sectional views illustrating manufacturing steps of the printed circuit board according to the first embodiment of the present invention. First, as shown in FIG. 2, the printed wiring board 1 including the recessed part 4 on the top surface is formed. Examples of the method of forming the recessed part 4 include cutting using a router, drill or the like, punching using a metal die and photoetching using a photosensitive material for an insulating layer. Next, as shown in FIG. 3, the bare chip part 5 is mounted in the recessed part 4 using the die bonding member 6 and the bare chip part 5 and the printed conductor 3b are electrically connected via the wire 7. Next, as shown in FIG. 4, solder pieces 11 and 13 are printed at necessary locations on the printed wiring board 1 using a solder mask 14. Next, the cap 9 and the electronic part 12 are placed on the solder pieces 11 and 13, then heated and cooled, and the cap 9 and the electronic part 12 are thereby fixed to the printed wiring board 1 as shown in FIG. 1.

Figure 5:
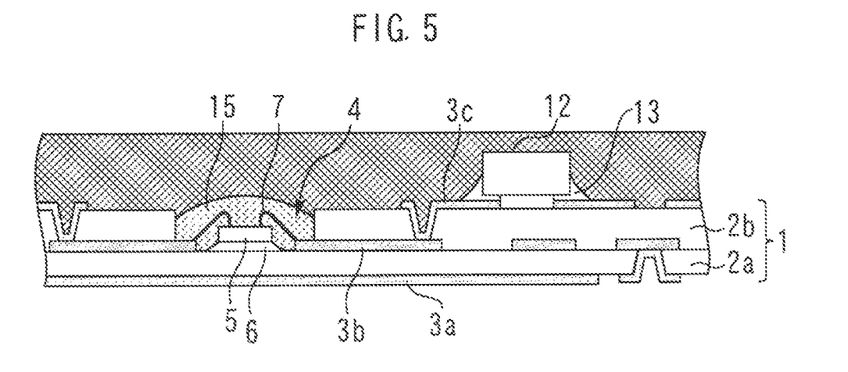
FIG. 5 is a cross-sectional view illustrating a printed circuit board according to a comparative example.

Next, effects of the present embodiment will be described in comparison with a comparative example. FIG. 5 is a cross-sectional view illustrating a printed circuit board according to a comparative example. In the comparative example, the interior of the recessed part 4 mounted with the bare chip part 5 is filled and sealed with resin 15. For this reason, a pressure when the resin 15 is applied or stress when the resin 15 hardens may cause the wiring or wire 7 on the surface of the bare chip part 5 to be deformed or peeled off, causing deterioration of reliability. Furthermore, the dielectric constant of the resin 15 causes a capacitance of wiring or between the wires 7 of the bare chip part 5 to increase, resulting in deterioration of high-frequency performance of the bare chip part 5.

On the other hand, in the present embodiment, the bare chip part 5 mounted in the recessed part 4 is hollow-sealed with the cap 9. For this reason, compared to the case where the bare chip part 5 is sealed with the resin 15, it is possible to prevent deterioration of reliability and high-frequency performance. Moreover, since the height of the top surface of the cap 9 is equal to or below a maximum height of the top surface of the electronic part 12, and therefore even when sealing with the cap 9 is performed, the thickness of the printed circuit board does not increase.

Figure 6:
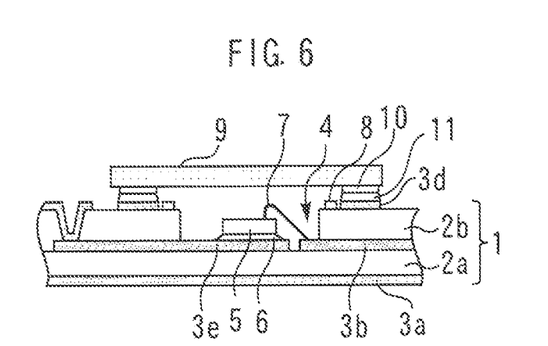
FIG. 6 is an enlarged cross-sectional view of a bare chip mounting section in modification 1 of the printed circuit board according to the first embodiment of the present invention.

FIG. 6 is an enlarged cross-sectional view of a bare chip mounting section in modification 1 of the printed circuit board according to the first embodiment of the present invention. The bare chip part 5 has an electrode on the back side as well. The bare chip part 5 and a printed conductor 3e in the recessed part 4 are connected using silver paste, gold tin solder or the like having conductivity as the die bonding member 6.

Figure 7:
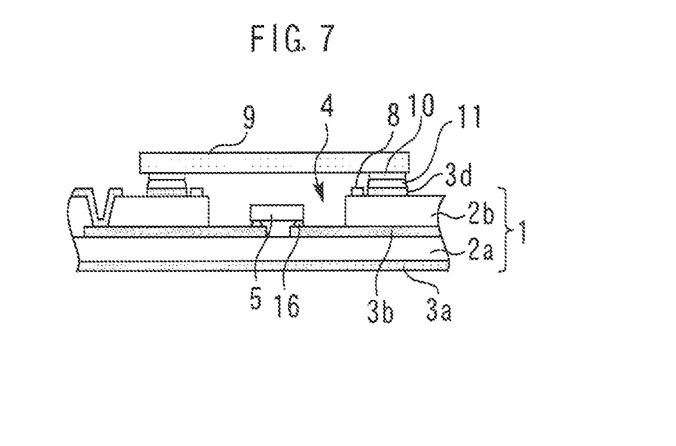
FIG. 7 is an enlarged cross-sectional view of a bare chip mounting section in modification 2 of the printed circuit board according to the first embodiment of the present invention.

FIG. 7 is an enlarged cross-sectional view of a bare chip mounting section in modification 2 of the printed circuit board according to the first embodiment of the present invention. The bare chip part 5 and the printed conductor 3b in the recessed part 4 are flip-chip connected using solder 16. In this way, the bare chip part 5 is fixed to the printed wiring board 1 while making an electrical connection.

In the present embodiment, the cap 9 is metallic, such as copper alloy, iron alloy or nickel alloy. The metallic cap 9 does not allow extraneous radio wave to pass therethrough, and can thereby prevent radio wave from entering the bare chip part 5 as noise. Note that for prevention of oxidation or for securing of solderability, gold plating or tin plating may be applied to the metallic cap 9.

In addition, the bare chip part 5 may also be a light-emitting device such as an LED or laser diode or a light-receiving device such as a photodiode or CMOS image sensor. In this case, the cap 9 is made of a material such as glass, acrylic resin or sapphire that allows to pass therethrough, light having a wavelength emitted or received by the bare chip part 5. This allows light emitted by the bare chip part 5 to radiate after passing through the cap 9 or allows light to enter the bare chip part 5 after passing through the cap 9, thus enabling light-emitting or light-receiving operation of the bare chip part 5.

Second Embodiment

Figure 8:
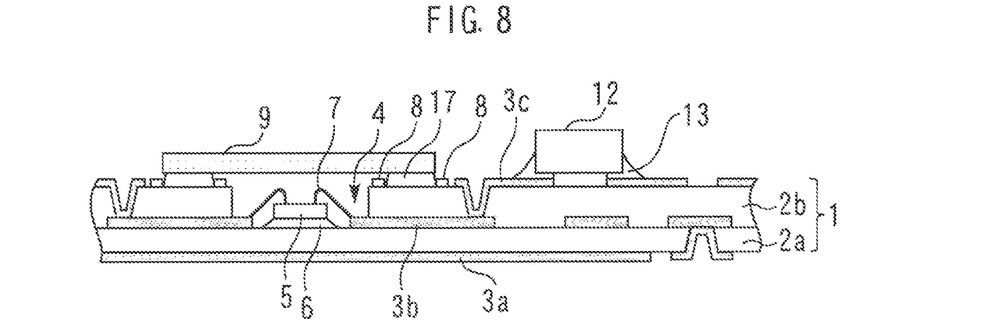
FIG. 8 is an enlarged cross-sectional view of a bare chip mounting section of a printed circuit board according to a second embodiment of the present invention.

FIG. 8 is an enlarged cross-sectional view of a bare chip mounting section of a printed circuit board according to a second embodiment of the present invention. The cap 9 is fixed to the printed wiring board 1 using a resin adhesive 17 such as epoxy resin or polyurethane resin. The flow stopper 8 that encloses the resin adhesive 17 prevents the resin adhesive 17 from flowing out in the periphery.

Figure 9:
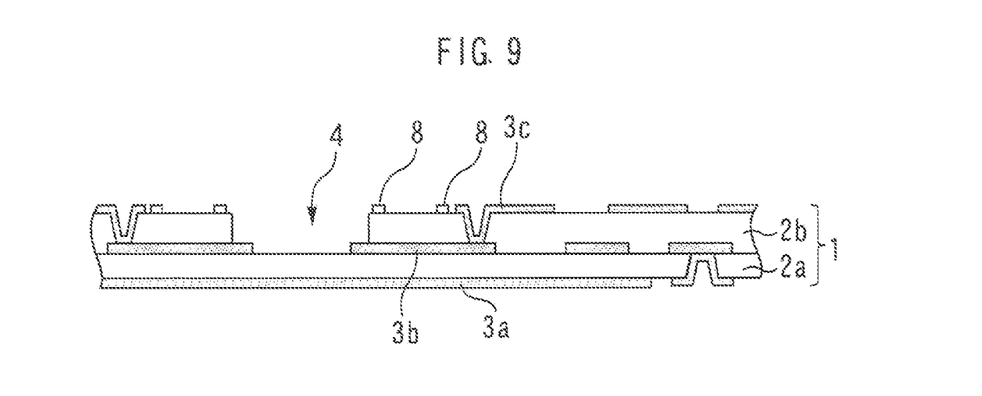
FIGS. 9 to 13 are cross-sectional views illustrating manufacturing steps of the printed circuit board according to the second embodiment of the present invention.
Figure 10:
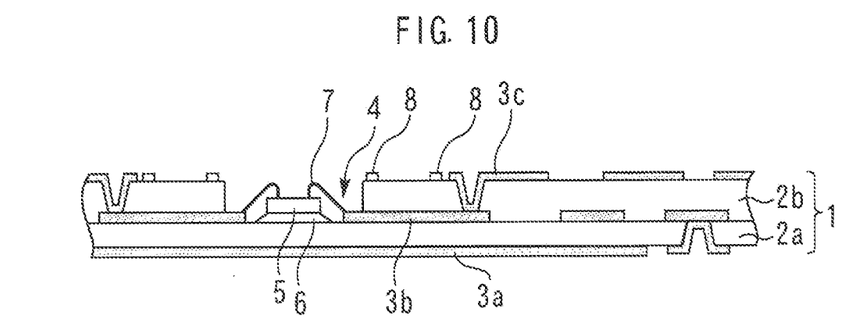

FIGS. 9 to 13 are cross-sectional views illustrating manufacturing steps of the printed circuit board according to the second embodiment of the present invention. First, as shown in FIG. 9, the flow stopper 8 is formed on the top surface of the insulating layer 2b. Next, as shown in FIG. 10, the bare chip part 5 is mounted in the recessed part 4 through the die bonding member 6. The bare chip part 5 and the printed conductor 3b in the recessed part 4 are connected via the wire 7.

Figure 11:
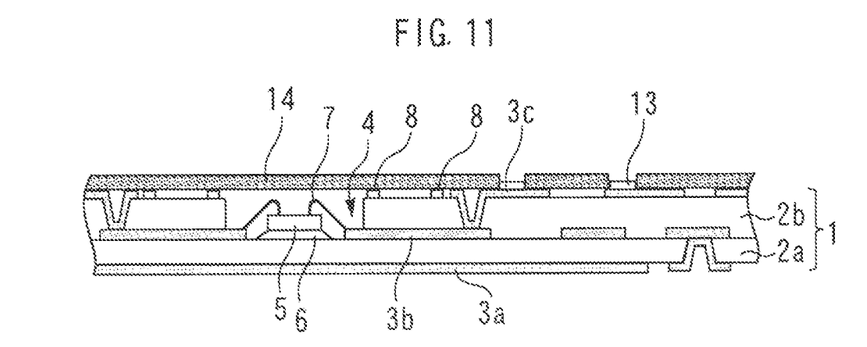
Figure 12:
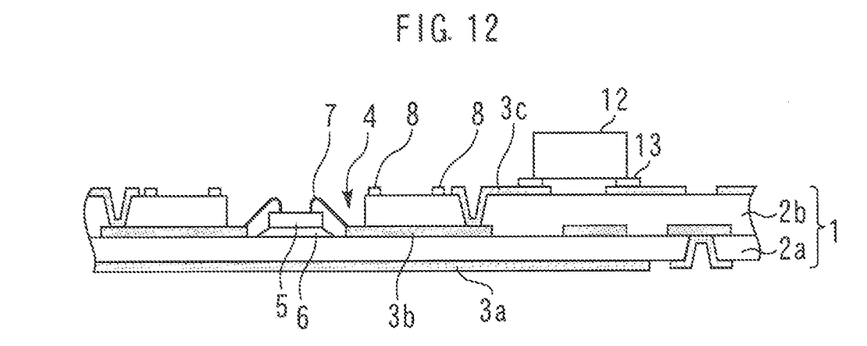
Figure 13:
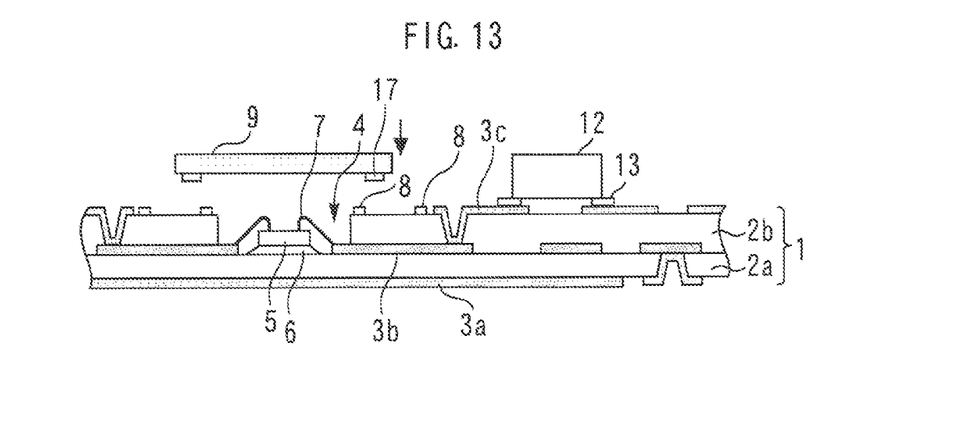

Next, as shown in FIG. 11, the solder 13 is printed on the printed wiring board 1 using the solder mask 14. Next, as shown in FIG. 12, the electronic part 12 is mounted on the solder 13. Next, as shown in FIG. 13, the recessed part 4 is covered with the cap 9 with a resin adhesive 17 attached to the back face thereof. Next, by heating and cooling, as shown in FIG. 8, the cap 9 is fixed to the printed wiring board 1 using the resin adhesive 17 and the electronic part 12 is fixed using the solder 13.

Figure 14:
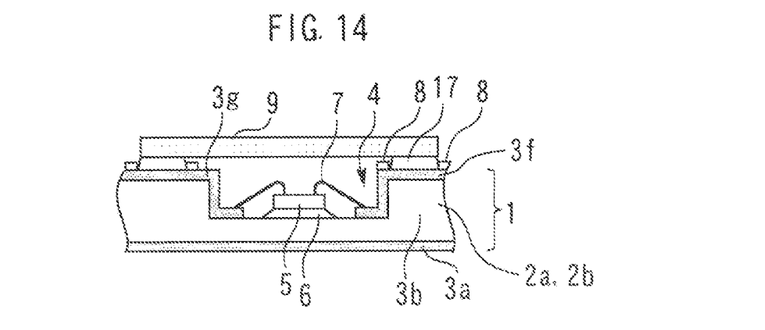
FIG. 14 is an enlarged cross-sectional view of a bare chip mounting section of a modification of the printed circuit board according to the second embodiment of the present invention.

FIG. 14 is an enlarged cross-sectional view of a bare chip mounting section of a modification of the printed circuit board according to the second embodiment of the present invention. Printed conductors 3f and 3g are formed ranging from the top surface of the insulating layer 2b to the wall surface and bottom surface of the recessed part 4. Using a non-conductive adhesive as the resin adhesive 17 that fixes the cap 9, it is possible to seal the recessed part 4 without electrically short circuiting the printed conductors 3f and 3g.

Third Embodiment

Figure 15:
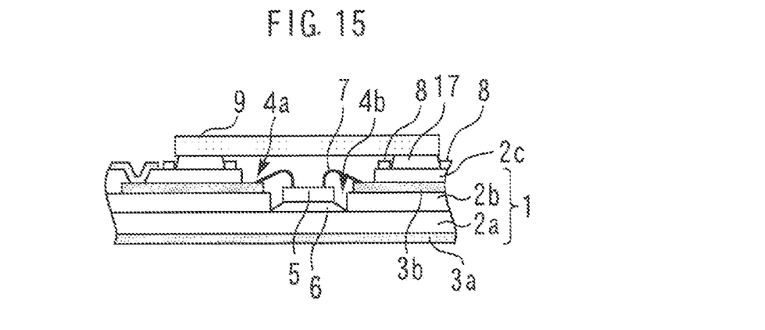
FIG. 15 is an enlarged cross-sectional view of a bare chip mounting section of a printed circuit board according to a third embodiment of the present invention.

FIG. 15 is an enlarged cross-sectional view of a bare chip mounting section of a printed circuit board according to a third embodiment of the present invention. Insulating layers 2b and 2c are opened, and first and second recessed parts 4a and 4b are formed respectively. The second recessed part 4b is provided on the bottom surface of the first recessed part and is narrower than the first recessed part 4a. The first and second recessed parts 4a and 4b provide a difference in height between the insulating layers 2a and 2b. The printed conductor 3b is provided on the bottom surface of the first recessed part 4a. The bare chip part 5 is mounted on the bottom surface of the second recessed part 4b. The bare chip part 5 and the printed conductor 3b are connected via the wire 7.

In the first embodiment, when the die bonding member 6 is applied to the bottom of the recessed part 4 to fix the bare chip part 5, the die bonding member 6 flows and spreads at the bottom of the recessed part 4. It is necessary to increase an interval between the bare chip part 5 and the printed conductor 3b so as to prevent the spread die bonding member 6 from being placed on the printed conductor 3b and blocking wire bonding.

On the other hand, according to the present embodiment, the die bonding member 6 remains inside the second recessed part 4b, with the difference in height between the insulating layers 2a and 2b serving as a flow stopper. Therefore, the printed conductor 3b can be disposed close to the bare chip part 5, and it is thereby possible to reduce the area necessary for mounting of the bare chip part 5 including the wire 7 and reduce the size of the printed wiring board 1. The present embodiment allows the wire 7 to be shorter to reduce the amount of wire used than the first embodiment that applies wire bonding up to the printed conductor 3b on the bottom surface of the recessed part 4.

Fourth Embodiment

Figure 16:
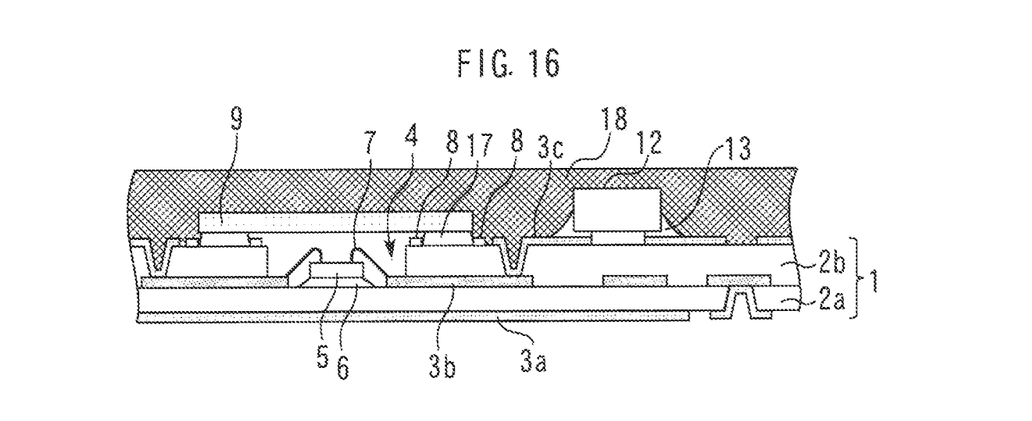
FIG. 16 is a cross-sectional view illustrating a printed circuit board according to a fourth embodiment of the present invention.

FIG. 16 is a cross-sectional view illustrating a printed circuit board according to a fourth embodiment of the present invention. An electronic part 12 mounted on the top surface of the printed wiring board 1 is sealed with resin 18 such as epoxy resin or fluororesin. It is thereby possible to avoid problems such as damage of the electronic part 12 due to contact of a support when the printed circuit board is assembled into an electronic device or operation error caused by foreign substances contacting the electronic part 12.

Figure 17:
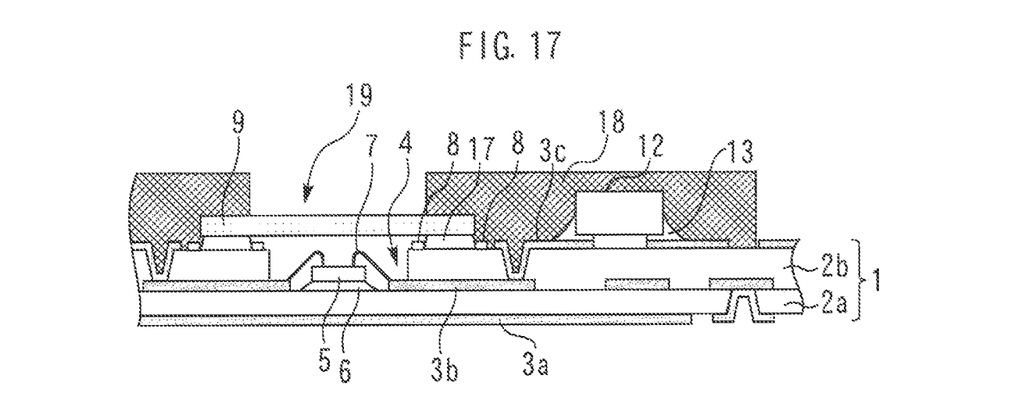
FIG. 17 is a cross-sectional view illustrating a modification of the printed circuit board according to the fourth embodiment of the present invention.

FIG. 17 is a cross-sectional view illustrating a modification of the printed circuit board according to the fourth embodiment of the present invention. The top surface of the printed wiring board 1 is covered with photosensitive resin 18 such as photosensitive polyimide. An opening 19 is formed in part of the resin 18 by photoetching to expose the top surface of the printed conductor 3b and the cap 9. This allows wire bonding on the printed conductor 3b, which enables the cap 9 to function as a window to allow light to pass therethrough when the bare chip part 5 is a light-emitting device or light-receiving device.

Fifth Embodiment

Figure 18:
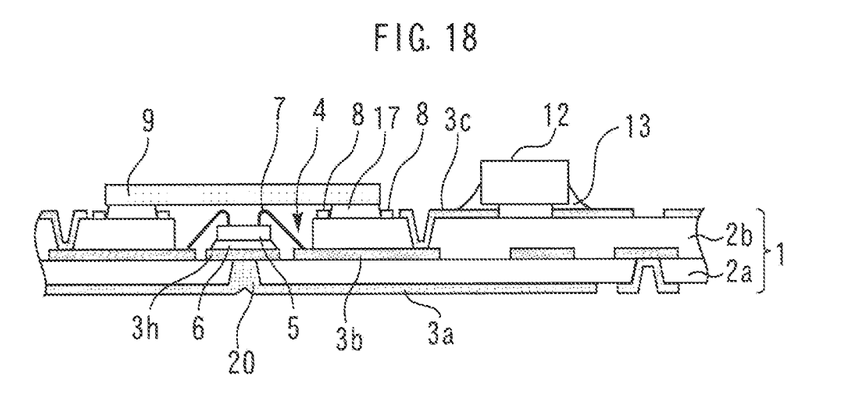
FIG. 18 is a cross-sectional view illustrating a printed circuit board according to a fifth embodiment of the present invention.

FIG. 18 is a cross-sectional view illustrating a printed circuit board according to a fifth embodiment of the present invention. The printed wiring board 1 includes a thermal via 20 provided below the mounting section of the bare chip part 5. The thermal via 20 corresponds to the printed conductors 3a and 3h on the top and bottom surfaces of the insulating layer 2a connected by copper plating via a hole that penetrates the insulating layer 2a. The thermal conductivity of copper which is the material of the thermal via 20 is higher than the thermal conductivity of glass-cloth epoxy resin or the like which is the material of the insulating layer 2a. Therefore, it is possible to improve heat dissipation from the bare chip part 5 in a downward direction of the printed wiring board 1. In the structure according to the present application in which the bare chip part 5 is hollow-sealed, heat dissipation of heat generated in the bare chip part 5 deteriorates compared to the conventional structure using resin sealing, and therefore improvement of heat dissipation using the thermal via 20 is particularly effective.

Sixth Embodiment

Figure 19:
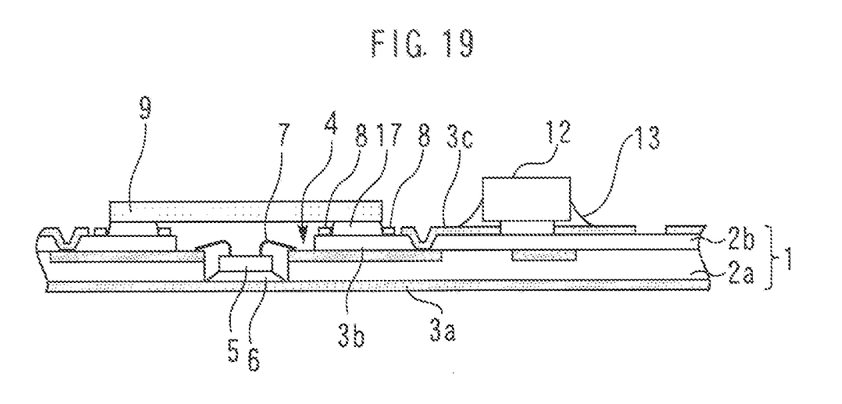
FIG. 19 is a cross-sectional view illustrating a printed circuit board according to a sixth embodiment of the present invention.

FIG. 19 is a cross-sectional view illustrating a printed circuit board according to a sixth embodiment of the present invention. The insulating layer 2a is opened up to the printed conductor 3a of the bottom surface of the printed wiring board 1 and the recessed part 4 is formed. The insulating layer 2a forms a side wall of the recessed part 4 and the printed conductor 3a is disposed below the recessed part 4. The printed conductor 3a of a copper alloy has a higher thermal conductivity than that of the insulating layer 2a of glass-cloth epoxy resin or the like and functions as a heat dissipation layer. Therefore, as in the case of the fifth embodiment, it is possible to improve heat dissipation from the bare chip part 5 in a downward direction of the printed wiring board 1. Note that a metal plate or ceramic plate which is different from the printed conductor 3a may be pasted together below the opened insulating layer 2a so as to serve as a heat dissipation layer.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-232651, filed on Nov. 17, 2014 including specification, claims, drawings and summary, on which the Convention priority of the present application is based, is incorporated herein by reference in its entirety.

What is claimed is:
1. A printed circuit board comprising:
   a printed wiring board including an insulating layer wherein a recessed part is provided on a top surface of the insulating layer, a first printed conductor is provided inside the recessed part, a second printed con- ductor is provided around the recessed part in a ring shape, and a solder flow stopper is provided inside the second printed conductor;

a bare chip part mounted in the recessed part and electrically connected to the first printed conductor;

an electronic part mounted on the top surface of the printed wiring board other than the recessed part; and a cap fixed to the second printed conductor of the printed wiring board by solder and hollow-sealing the bare chip part mounted in the recessed part, wherein using a height of the top surface of the printed wiring board as a reference, a height of a top surface of the cap is equal to or below a maximum height of a top surface of the electronic part.

2. The printed circuit board of claim 1, wherein the recessed part includes a first recessed part and a second recessed part which is provided on a bottom surface of the first recessed part and is narrower than the first recessed part, the first printed conductor is provided on the bottom surface of the first recessed part, the bare chip part is mounted on a bottom surface of the second recessed part, and the bare chip part and the first printed conductor are connected via a wire.

3. The printed circuit board of claim 1, wherein the cap is metallic.

4. The printed circuit board of claim 1, wherein the bare chip part is a light-emitting device or a light-receiving device, and the cap is made of a material that allows to pass light having a wavelength emitted or received by the bare chip part.

5. The printed circuit board of claim 1, further comprising a resin sealing the electronic part.

6. The printed circuit board of claim 1, wherein the printed wiring board includes a thermal via provided below a mounting section of the bare chip part.

7. The printed circuit board of claim 1, wherein the printed wiring board includes an insulating layer forming a side wall of the recessed part, and a heat dissipation layer exposed at a bottom surface of the recessed part, and the heat dissipation layer has a higher thermal conductivity than that of the insulating layer.

* * * * *